US005530251A

United States Patent [19]
Petric

[11] Patent Number: 5,530,251
[45] Date of Patent: Jun. 25, 1996

[54] INDUCTIVELY COUPLED DUAL-STAGE MAGNETIC DEFLECTION YOKE

[75] Inventor: Paul F. Petric, Brewster, N.Y.

[73] Assignee: International Business Machines Corporation, Armonk, N.Y.

[21] Appl. No.: 360,521

[22] Filed: Dec. 21, 1994

[51] Int. Cl.⁶ .................................................. H01J 37/141
[52] U.S. Cl. ....................................................... 250/356 ML
[58] Field of Search .......................... 250/396 ML, 398; 313/421

[56] References Cited

U.S. PATENT DOCUMENTS

| | | | |
|---|---|---|---|
| 3,631,902 | 1/1972 | Torsch | 140/92.1 |
| 3,671,896 | 6/1972 | Torsch | 355/213 |
| 3,914,608 | 10/1975 | Malmberg . | |
| 3,984,687 | 10/1976 | Loeffler et al. | 250/396 ML |
| 4,232,253 | 11/1980 | Mortelmans | 315/370 |
| 4,395,691 | 7/1983 | Knauer | 250/396 ML |
| 4,431,915 | 2/1984 | Nakagawa et al. . | |
| 4,544,846 | 10/1985 | Langner et al. . | |
| 4,870,286 | 9/1989 | Tobuse . | |
| 5,039,922 | 8/1991 | Ogasa et al. | 315/370 |
| 5,136,167 | 8/1992 | Langner et al. . | |
| 5,276,331 | 1/1994 | Oae et al. . | |

Primary Examiner—Bruce C. Anderson
Attorney, Agent, or Firm—Whitham, Curtis, Whitham & McGinn; Charles W. Peterson Jr.

[57] ABSTRACT

A deflection yoke for controlling a charged particle beam, such as an electron beam, comprises a toroidal core, which may be ferromagnetic material or not, a major yoke winding, and a minor yoke winding. The major and minor yoke windings are arranged to minimize mutual inductance between the major winding and the minor winding. The major yoke winding is a toroidal winding about the core and said minor yoke winding is a saddle winding on said core. In one embodiment, the minor winding comprises a first saddle winding inside the toroidal core and a second saddle winding outside the toroidal core. A reactive shunt is connected across the first saddle winding or the second saddle winding. The reactive shunt provides a shunt current path to balance flex contribution in the core from the first and second saddle windings so that excitation of the minor yoke does not induce any excitation in the major yoke. The toroidal core may comprise one or two alternating stacks of ferromagnetic rings and non-ferromagnetic rings. This construction provides a core that does not perturb a lens field into which the deflection yoke may be placed. The non-ferromagnetic rings are made of a ceramic or other material having a coefficient of thermal expansion matched, or nearly so, to that of the ferromagnetic rings to prevent thermal stresses in the core.

6 Claims, 8 Drawing Sheets

INDUCTIVELY COUPLED DUAL-STAGE MAGNETIC DEFLECTION YOKE

BACKGROUND OF THE INVENTION

1. Field of the Invention

The present invention generally relates to charged particle beam (e-beam) deflection systems and, more particularly, to a deflection system employing two sets of windings on the same core intended to provide two independent channels of dynamic electron beam positioning with different time responses.

2. Description of the Prior Art

In applications of charged particle beam and specifically of electron beam technology, for example, the lithography of integrated circuit patterns, speed of deflection is of critical importance to obtaining practical throughputs for an electron beam deflection system design. In a typical system design, a number of stages of beam deflection are used to better amortize the settling times of deflection so that an effectively shorter settling time is realized and therefore a higher throughput is achieved.

In almost all e-beam lithography systems designed in the last twenty years or so, at least two stages of deflection have been incorporated. One stage of magnetic deflection and one stage of electric deflection. The magnetic deflection is used to deflect the beam at relatively large distances with high precision; however, long settling times are required to achieve this precision. The electric deflection is then used to deflect the beam within a relatively small area but at substantially higher speeds. Thus, the beam is deflected within the total field of the deflection system, to each of a relatively small number of subfields at relatively slow speeds by the first stage of deflection. The beam is then deflected to a large number of beam or pattern locations within each of the subfields by the second stage of deflection at very fast speeds. As a result, the two stage deflector is much faster for the same precision and deflection field size than is the single stage deflector. The reason for this is that precision and speed act counter to each other. A high precision deflector requires more time to settle than does one of less precision for the same maximum deflector range. Also, magnetic deflectors are practically much easier to deflect over large areas than are electric deflectors.

U.S. Pat. No. 5,136,167 describes an e-beam lithography system in which an additional stage of magnetic deflection is incorporated so that larger deflection fields can be achieved at even faster speeds. This is achieved by elaborate means to retain telecentric deflection for all three stages of deflection. This system also incorporates telecentric and low aberration deflection over large areas.

This presents a problem if the two stages of magnetic deflection are used where the major and minor deflectors are required to be at the same position along the length of the beam. This is the case when there is limited space in which to position the two yokes or as in the Variable Axis Immersion Lens (VAIL) where the two deflection yokes (referred to as correction yokes in VAIL) must both generate identical magnetic fields, to cancel the first derivative of the axial lens field. This implies that the two fields are directly coupled magnetically and therefore inductively. This is where the problem arises. If the two yokes are inductively coupled, the speed of deflection cannot exceed the slowest yoke speed. This comes about because if the faster yoke is excited and it is inductively coupled to the slower yoke, the excitation of the faster yoke will induce an excitation in the slower yoke which will then settle to the required precision in the same time as would be the case if the slower yoke were initially excited. In order to make two stages of deflection, two identical magnetic fields must be generated by two different deflection yokes located in the same location and yet remain inductively decoupled.

In addition, for large field deflection system design, high sensitivity is required to keep the electronic driver circuitry within practical limits. The most efficient way to achieve this, particularly with toroidally wound yokes, is by the use of ferromagnetic cores. Ferrite is the most common core material because it obtains the high magnetic permeability required for a good core material but does not support the generation of eddy currents which can slow the settling time and therefore the deflection speed. However, if the core material is immersed in a lens field or other deflection fields, it can alter this field in a deleterious way. Most deflection system designs today are designed in conjunction with a lens to optimize aberrations and distortions of the deflection of an electron beam. Thus, the placement of a given deflection yoke is dictated by this optimization. In the case of the variable axis immersion lens (VAIL) type deflection system described in U.S. Pat. No. 4,544,846, the yoke must be fully immersed in the lens field at the location of the peak of the first derivative with respect to 2. If a yoke with a typical ferrite core were to be placed inside a magnetic lens, the core material would short the field inside the lens and cause large distortion and aberrations.

SUMMARY OF THE INVENTION

It is therefore an object of the present invention to provide a high sensitivity deflection yoke which can be immersed in a lens field without altering the optical characteristics of the lens and at the same time supporting the generation of two identical magnetic fields without inductive coupling between the two yokes.

According to the invention, there is provided a deflection yoke for controlling a particle beam, such as an electron beam, which comprises a toroidal core, a major yoke winding, and a minor yoke winding. The major and minor yoke windings are arranged to minimize mutual inductance between the major winding and the minor winding. The major yoke winding is a toroidal winding about the core and said minor yoke winding is a saddle winding on said core. In one embodiment, the minor winding comprises a first saddle winding inside the toroidal core and a second saddle winding outside the toroidal core. A reactive shunt is connected between the first saddle winding and the second saddle winding. The reactive shunt provides a shunt current path to balance the first and second saddle windings so that excitation of the minor yoke does not induce any excitation in the major yoke. The toroidal core may comprise one or two alternating stacks of ferromagnetic rings and non-ferromagnetic rings. This construction provides a core that does not perturb the lens field. The non-ferromagnetic rings are made of a ceramic having a coefficient of thermal expansion matched to that of the ferromagnetic rings.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF A PREFERRED EMBODIMENT OF THE INVENTION

Figure 1:
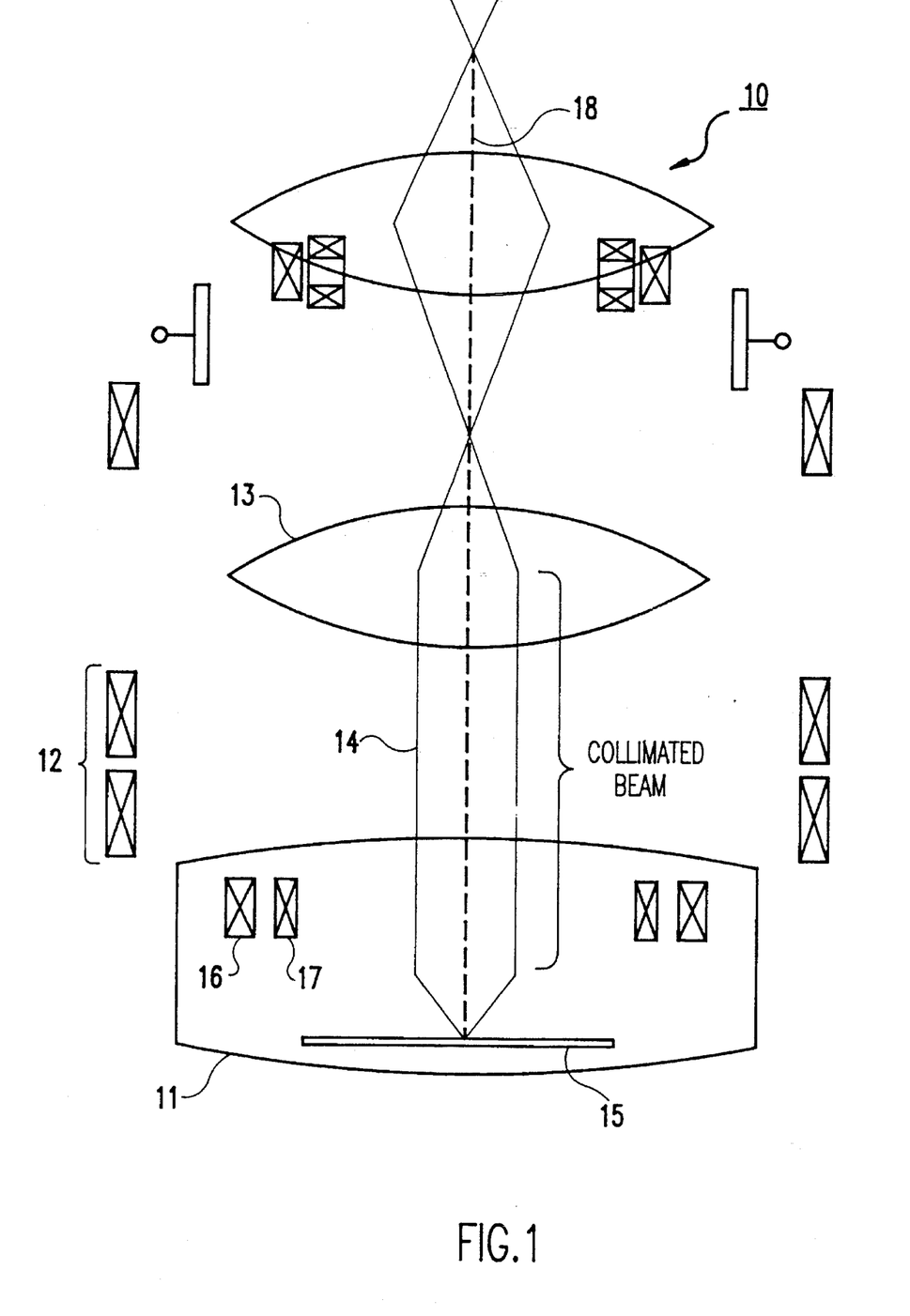
FIG. 1 is a schematic diagram of the electron optical deflection system in which the present invention is implemented.

Referring now to the drawings, and more particularly to FIG. 1, there is shown a schematic diagram of the layout of an array 10 of electron optical elements in an electron beam deflection system in which the present invention is implemented. The VAIL projection lens 11, as particularly described in U.S. Pat. No. 4,544,846, major magnetic field deflectors 12, and collimator lens 13 are also used in the existing VAIL deflection system to project and position an electron beam 14 onto target 15. The field deflectors 12 are provided to obtain telecentric major deflection. A collimator lens 13 is provided above the field deflector to collimate the electron flow before it enters the field deflector 12. As is well known in the art, a collimator lens will cause electrons traveling along a line from the intersection of the axis of the lens and its back focal plane to assume a path, upon leaving the lens, which will be parallel to the optical axis of the lens. However, such lenses also have the property that electrons travelling along paths intersecting each other at the back focal plane at a point other than the axis will be caused to assume parallel paths, upon leaving the lens, which are not necessarily parallel to the optical axis.

The projection lens 11 performs a substantially complementary function to the collimating lens, to focus electrons following parallel paths on a single point of target 15. In this sense, the collimator lens 13 and the projection lens 11 can be viewed as two parts of a single lens focussing an image of the object at the back focal plane of the collimator lens 13 at the front focal plane of lens 11 which is coincident with the target plane 15. It should, accordingly, be understood that the collimator lens and the projection lens are also similar in their operation in that an object or image is at the focal plane of each of these lenses.

Deflection by the field deflector 12, which is preferably a magnetic deflector, does not disturb the collimation of the beam since the angle of deflection of any electron will be a constant angular change from the initial angel of the electron path. Therefore, electrons following parallel paths upon entry into the field deflector 12 will also emerge from deflector 12 along parallel paths and will be focussed on the same spot by the projection lens 11 due to the action of the correction yoke or yokes 16, 17 included therein. The correction yoke is so named because it corrects coincident with the beam location, in accordance with the VAIL concept and to avoid variance from telecentricity. The correction yoke is preferably divided into a major correction yoke 16 with a minor correction yoke 17. These yokes are preferably concentric and located at the same position along the electron optical axis 18. This position is given by the shape of the projection lens field distribution along the axis. More precisely, the position is at the peak value at the first derivation of the lens distribution with respect to z.

Figure 2A:
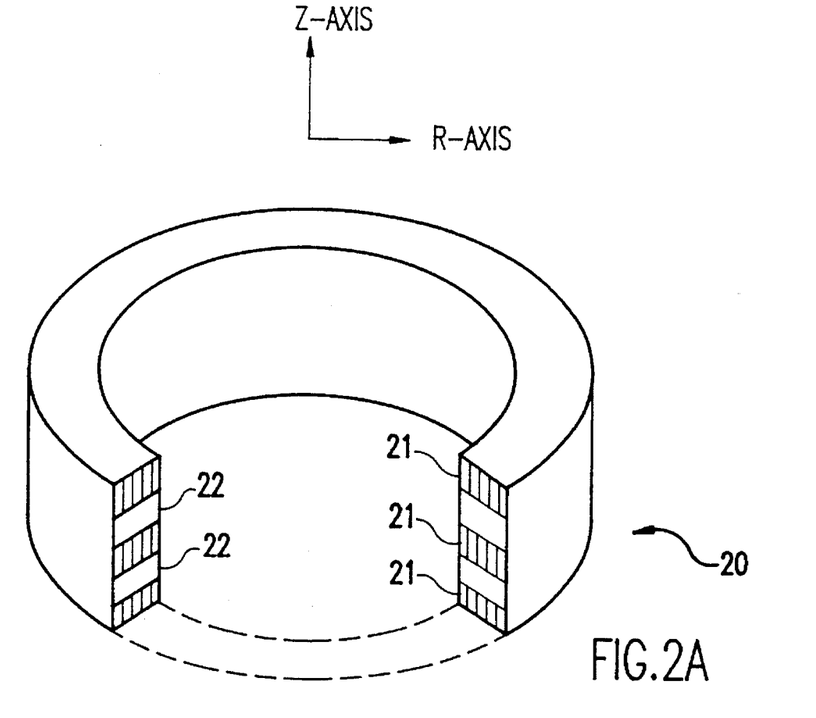
FIG. 2A is an isometric view, partially cut away, of a stacked toroidal core for field variations in the z-axis.

First, the problem of perturbing the lens field, which determines the optical characteristics of the lens, will be addressed. This invention uses a high permeable core material; that is, a ferromagnetic material for obtaining high sensitivity deflection yokes for large field deflection. Requirements to achieve high speeds coupled with large deflection fields necessitates more than one stage of deflection. By making this core as a stack of alternating ferromagnetic material and non-ferromagnetic material, a core can be constructed which does not perturb the lens field. The stack is formed such that the alternating materials of the stack alternate along the direction of the dominate field change. In a normal axially symmetric lens, this direction would be along the axis of symmetry. Thus, as illustrated in FIG. 2A, the core 20 used in the preferred embodiment of this invention is an alternating stack of ferromagnetic rings 21 and non-ferromagnetic rings 22.

The materials used in this preferred embodiment are ferrite, which is actually considered a ceramic material, and a non-ferromagnetic material, such as a ceramic material of matched coefficient of thermal expansion to that of the ferrite. This prevents stress in the core due to temperature changes like those resulting from resistive heating when the yoke windings are excited. These stresses, if they are large enough, depending on the particular application of the invention, could cause cracking of the core.

The size of the alternating rings is determined by the amount of core material needed to support the field of the yoke (and lens field if the application requires the yoke core be immersed in the lens) without saturating the core material and by the tolerable perturbation of any lens field (or other fields) if present. The saturation of the core is caused by the combination of the yoke field and the lens field if it is present. The perturbation of a lens field occurs as a result of the core ferromagnetic material short circuiting the field of the lens. The amount of this short circuiting can be minimized by the size of the alternating rings in both the axial direction and in the radial direction. If the field of the lens is varying rapidly, then the rings should be smaller in that direction. In this embodiment, the rings would be made thinner, for example. Normally, if the core were solid the perturbation to the lens will be too great to tolerate.

Figure 2B:
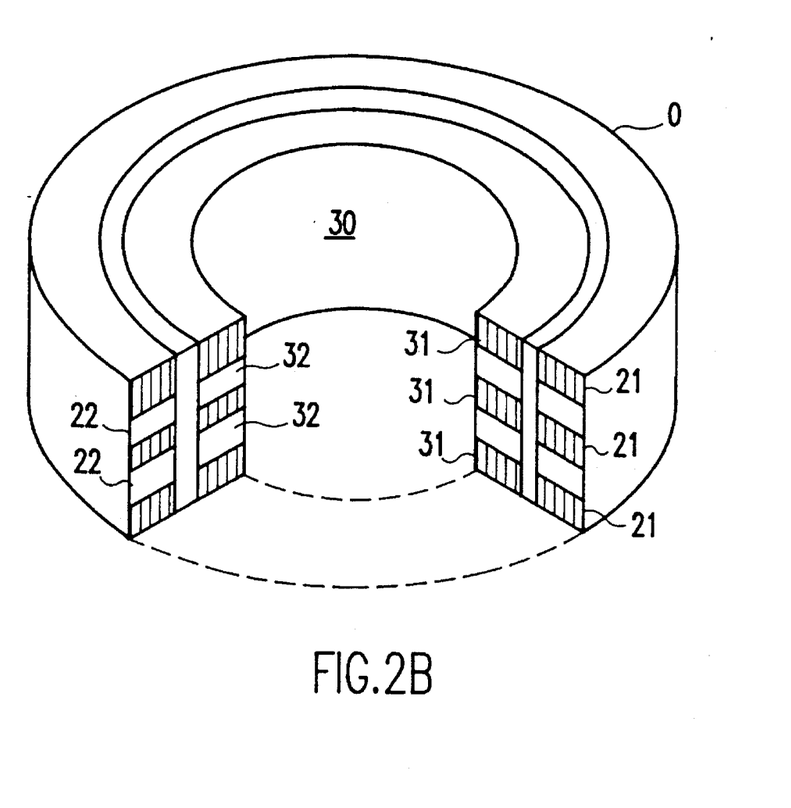
FIG. 2B is an isometric view, partially cut away, of a stacked toroidal core for field variations in the r and z-axes.

The core, usually of an annular shape, can also be composed of rings of ferrite separated by non-ferrite (ceramic) in both the axial and the radial directions, as shown in FIG. 2B. Thus, concentric cores 20 and 30, each composed of respective alternating stacks of ferromagnetic rings 21 and 31 and non-ferromagnetic rings 22 and 32, can be constructed to minimize the perturbation of the lens field in both directions. This is necessary for the case where the radial field changes rapidly or where the core cross-sectional area must be large. In the later case, the rings might be required to have too large a distance between the inner and outer diameters and therefore a single ring (in the radial direction) would short a significant amount of the lens field. This would have the same effect in perturbing the lens field as if the lens field changed rapidly over a smaller ring.

The inductive decoupling of two yokes (one fast and one slow) which generate identical fields (and thus, which must reside in the same physical location) is necessary in order to achieve, in reality, the attribute that one will indeed be fast. In the preferred embodiment, this inductive decoupling is achieved by winding the yokes such that there is no net flux of one yoke linking the windings of the other yoke. The requirement for achieving two different speeds is only that there is no net flux of the fast yoke linking the windings of the slow yoke. In this embodiment, the converse is also achieved. That is, there is no net flux from the slow yoke linking the windings of the fast yoke.

In the description of how this is achieved, a ferromagnetic core will be used. For this part of the invention, it is not necessary to use a ferromagnetic core, nor is the stacked core described above required. However, for the application in which the invention is used, that of VAIL deflection's system, the stacked core is required. For the purpose of describing this invention, a solid ferrite core is used. The use of a core material in the description also makes the concept more clear.

By incorporating two different types of winding patterns, the goal of no net flux linkage and therefore no inductive coupling of two yokes can be achieved. In the preferred embodiment, the two winding patterns used are the toroidal winding for the major yoke (slower speed yoke but larger range) and the saddle winding for the minor yoke (faster speed but smaller range). It is advantageous (but not necessary) for the two winding patterns to be used in this way. The toroidal winding can be made to much higher accuracies with greater ease and be perfectly symmetric for two axes deflection yokes. The toroidal winding, particularly when used in conjunction with a core is, therefore, better suited to the larger range deflection which needs the most precision. The saddle winding is better suited to the minor deflection because it is harder to wind to high accuracy and is inherently asymmetric.

Figure 3:
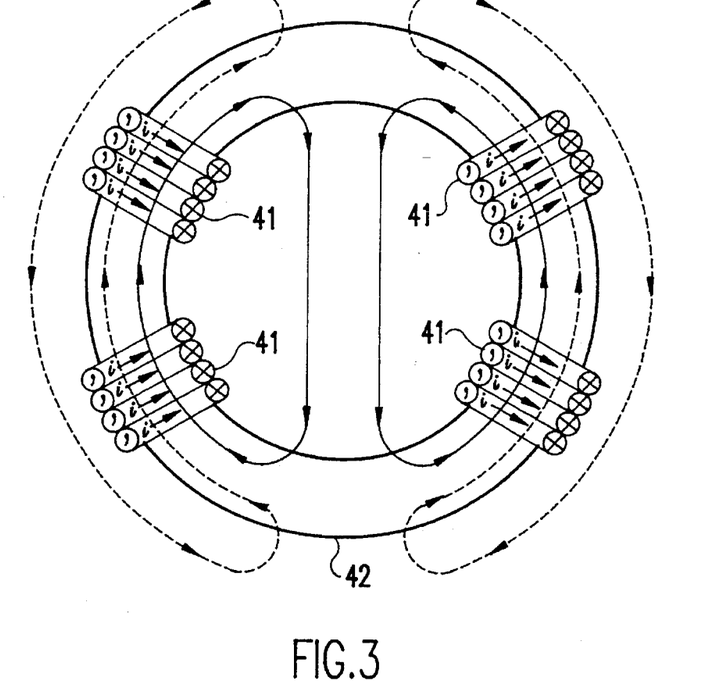
FIG. 3 is a plan view showing the yoke winding on the toroidal core and the resultant flux flow.

FIG. 3 shows the flux lines or field established by the toroidal or major yoke 41. The core 42 is located inside the toroid and the flux runs throughout the core in a circumferential or azimuthal direction inside the toroid. To create a deflection field from a toroidal winding, the current in one half of the toroidal windings flows in one direction and in the other half of the windings it flows in the opposite direction. This creates a magnetic flux in the core which travels azimuthally in one direction for half of the core and in the opposite direction for the other half. At the symmetry points at the ends of the two sets of windings, the flux exits or enters the core. The flux that exits the core on the inside is the sum of the 2 halves from each side of the core. It travels the length of the symmetry diameter and then re-enters the core dividing in half again to follow the core back to the exit point completing the magnetic circuit.

The flux which flows the length of the symmetry diameter in the central area of the core constitutes the deflection field. The uniformity and, therefore, the "goodness" of the deflection field (in the central area) is determined and optimized by the distribution of turns on each half of the core. Usually this distribution, particularly for the case of the toroidal windings is designed to create the most optimum field with the simplest winding distribution and one that if rotated 90° will not overlap any of the initial winding distribution's turns. This then provides a two axis yoke for which both axes are symmetric.

In the FIGS. 3 through 7 only one axis of the yoke windings is shown for the sake of simplicity and clarity. The view is looking down the optical axis or axis of symmetry. The yoke windings are shown with circles at the ends which indicate the current flow in the windings. A dot indicates current flow out of the page and the X indicates current flow into the page. The windings are shown as the top windings or the ones nearest to the observer.

Figure 4:
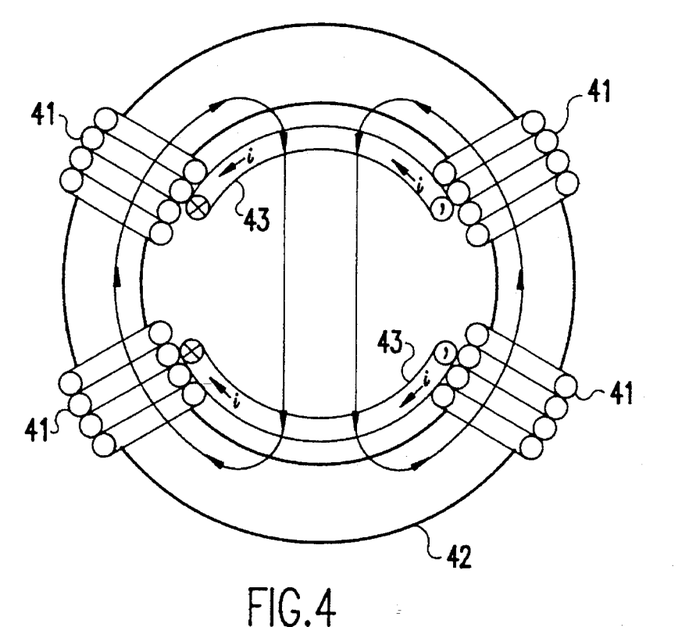
FIG. 4 is a plan view similar to FIG. 3 showing the inner saddle winding on the toroidal core and the flux flow from the inner saddle winding only.

If a saddle winding distribution 43 (or another toroidal distribution) were wound on the inside of the same core as is used for the toroid, the resultant flux flow in the core would be that which is shown in FIG. 4. It is readily seen that to obtain the same shape deflection field (not necessarily of the same magnitude) in the central area as that generated by the toroidal winding, the return flux (that which is in the core) is also exactly as for the toroidal winding. This constitutes 100% coupling between the two windings and is the worst case coupling of the two yoke windings. Anytime the minor winding 43 is excited, an excitation is also induced in the major winding which results in a settling time governed by the resonance frequency of the major winding. Thus, a long settling time equal to that for the slowest or major winding is the result and there is no improvement in speed.

Figure 5:
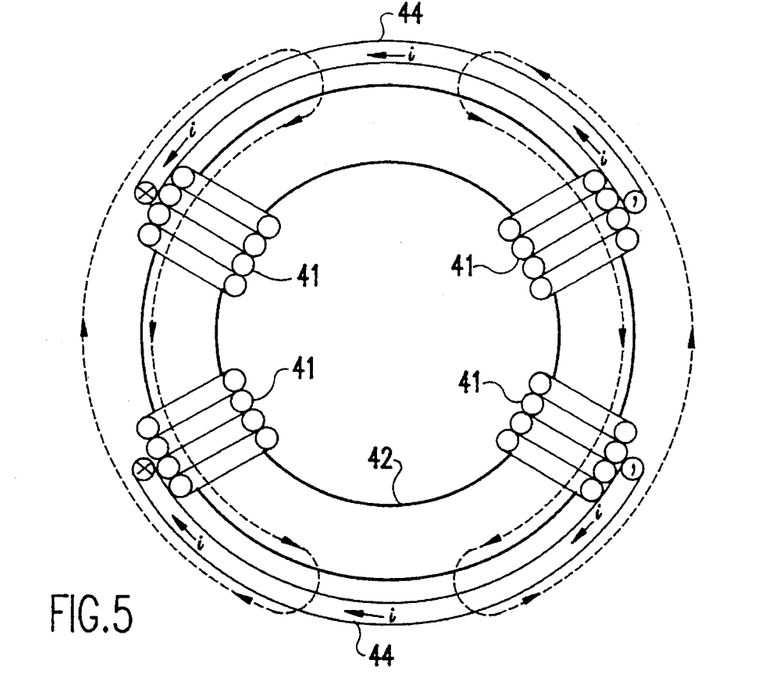
FIG. 5 is a plan view similar to FIG. 3 showing the outer saddle winding on the toroidal core and the flux flow from the outer saddle winding only.

If the saddle winding 44 is placed on the outside of the core, as shown in FIG. 5, the flux now in the core is the same but in the opposite direction. There is, however, no flux in the central region of the core which is the flux that is needed for the deflection field. Again, this constitutes 100% coupling to the toroidal winding but resulting in no deflection field which is the primary objective.

Figure 6:
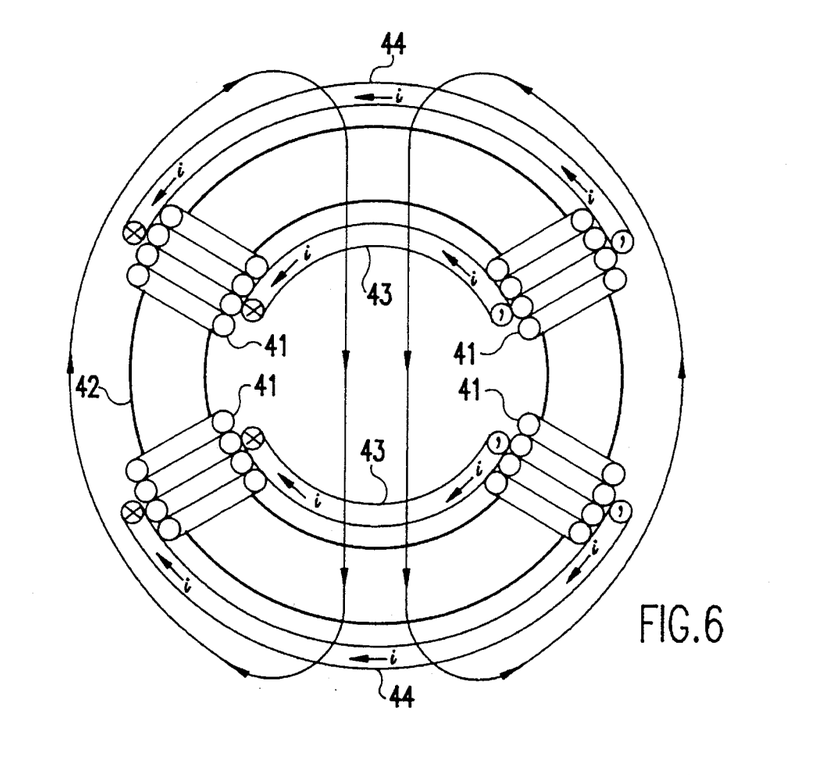
FIG. 6 is a plan view showing the inner and outer saddle windings on the toroidal core and the resultant flux flow from the combination of the inner and outer saddle windings.
Figure 7:
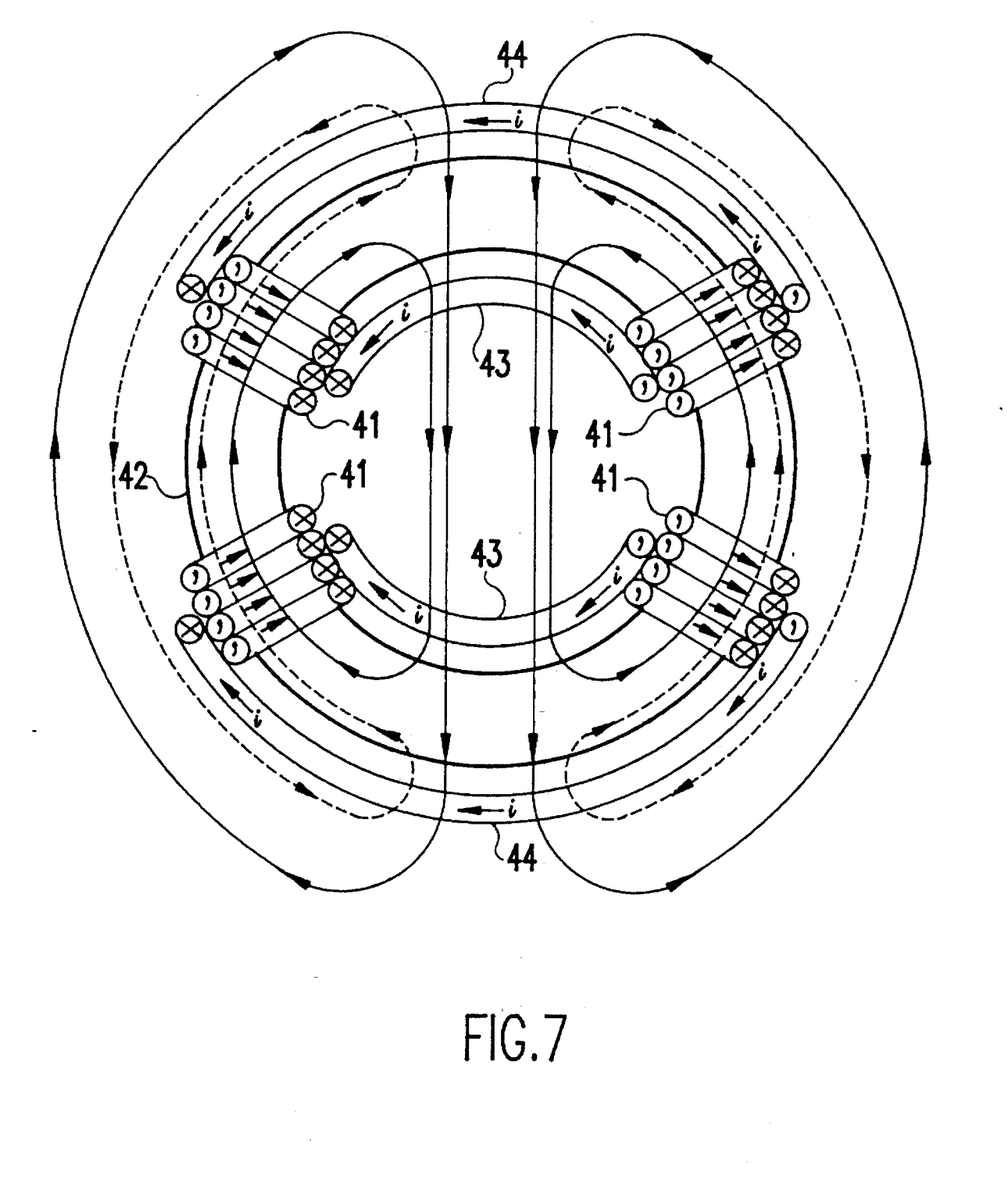
FIG. 7 is a plan view similar to FIG. 6 showing the flux flow from both major and minor yoke windings.

However, if identical saddle windings 43 and 44 are placed on both the inside and outside of the core 42, the net flux in the core is zero, as shown in FIG. 6. This is because the flux from the two saddle windings is equal in amplitude but flows in opposite directions in the core, and therefore, cancel and establish an azimuthal flux flow which is outside the core. In this case, the flux established by the two saddle windings penetrates the core orthogonally to the core and, therefore, there is no return flux linking the toroidal windings. This added saddle winding 44 eliminates any net flux from the minor (saddle) yoke 43 linking the windings of the major (toroidal) yoke 41. Therefore, no inductive coupling is present between the two yokes. This double wound saddle yoke provides the desired solution. In addition, the added turns of the saddle yoke result in a yoke of the same sensitivity as the single wound saddle yoke wound on a core material. The combined flux pattern from both the minor (saddle) yoke 43, 44 and the major (toroidal) yoke 41 is shown in FIG. 7.

In practice, it is very difficult to make the inner and outer saddle yokes identical. This will result in less than 100% decoupling of the major and minor yokes. Any small difference between the inner and outer windings can give rise to a small net flux linkage. This might be because of a misalignment between the inner and outer saddle windings or between the major and minor windings, dimensional errors in the windings or the diameter difference between the inside and outside of the core, or from leakage flux. If this net flux is large enough, it can cause enough excitation of the major yoke by the minor to slow the deflection to an unacceptable level.

This net flux level can be eliminated by balancing the strengths of the inner and outer saddle windings. This can be done by varying the current in either winding. An easy way to do this is to shunt some of the current flowing in one half (inside saddle 43) or the other half (outside saddle 44) of the combined saddle winding. Generally, only a small percentage of current needs to be shunted to balance the flux and, therefore achieve a net zero flux linkage.

Figure 8:
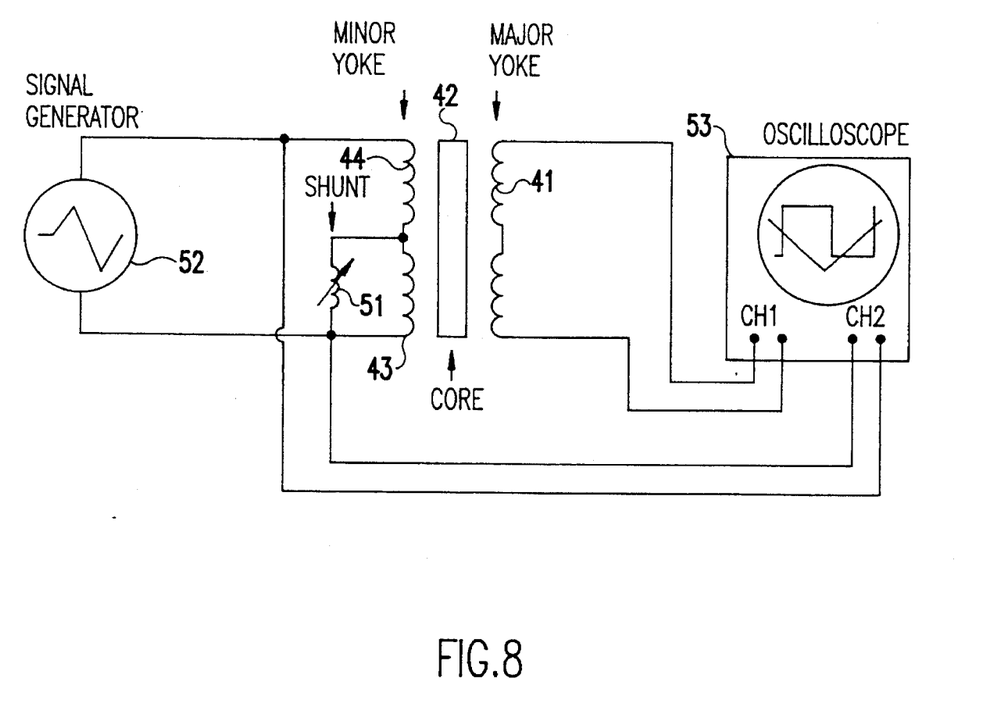
FIG. 8 is a schematic diagram showing a test setup for balancing flux in the yoke.

Deflection yokes typically operate over a range of frequencies. In addition, it is the time dependant aspects of the yoke that are of interest when considering a major and minor yoke configuration. For these reasons, the preferred embodiment requires a reactive shunt; that is, one that obtains the required percentage shunt over the operating range of frequencies or settling times of the yoke being balanced. A schematic of a shunt 51 used on an embodiment of the invention is shown in FIG. 8 along with a test setup for balancing the saddle windings. The test setup comprises a signal generator 52 connected across the minor yoke comprised of saddle windings 43 and 44 and also to the horizontal deflection input of oscilloscope 53. The major yoke 41 is connected to the vertical deflection input of oscilloscope 53. The reactive shunt 51 is connected across the inside saddle winding 43 (on the outer saddle winding 44 which even has the larger contribution in the core) and is adjustable to shunt a variable amount of current from the inside saddle winding 43 (or outside winding 44) until the flux contributions in the core are equal.

Figure 9A:
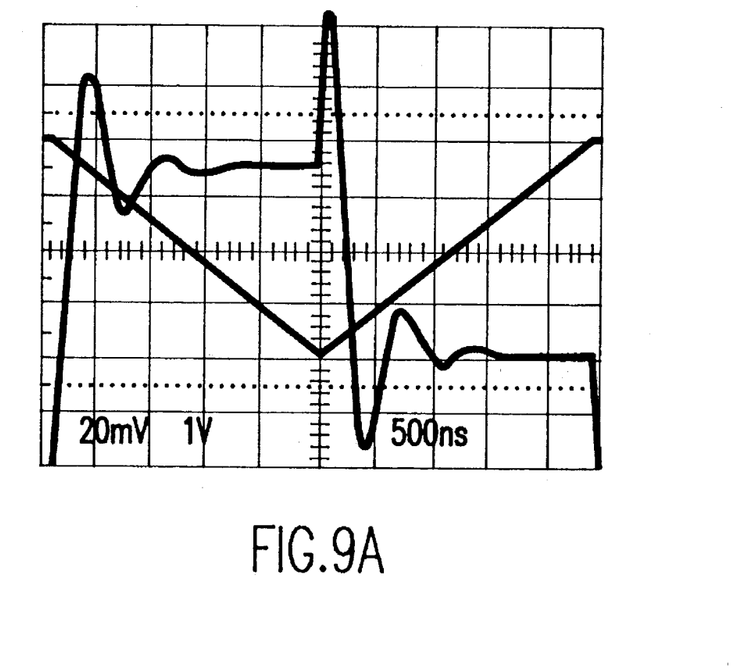
FIGS. 9A and 9B are oscillographs showing unbalanced and balanced traces, respectively.
Figure 9B:
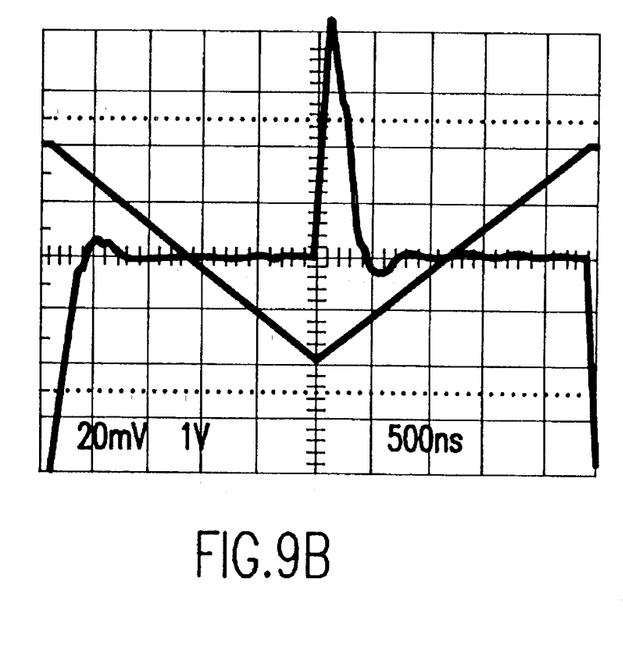

In the embodiment, the shunt 51 was adjusted so that an excitation of the minor yoke 43, 44 does not induce any excitation in the major yoke 41. The oscilloscope traces in FIG. 9A and 9B show the unbalanced case (no shunt) and the balanced case, respectively. One yoke (major or minor) is excited with the triangle waveform shown in both of the trace photographs. The other yoke then differentiates this signal according to -L di/dt giving the bilevel trace in the oscillographs. If the two horizontal levels resulting from each half of the triangle waveform are at two different levels, then the flux from the inner and outer saddle windings is unbalanced. Balance can be achieved by adjusting the inductive shunt until the two halves are at the same horizontal level. The adjustment moves the horizontal levels further apart. The shunt should be placed across the other (outer) saddle winding. The remaining glitch at the beginning of each half of the horizontal levels is all artifact of the test setup. It was believed to be caused by pickup from the cables of the less than perfect test setup.

The reactive shunt 51 used in the embodiment described herein was a simple variable inductor. More elaborate RCL (resistance/capacitance/inductance) circuits may be used to exactly match any time dependent variations of the balancing over a broad range of frequencies. This, however, was not necessary in the embodiment tested.

Figure 10A:
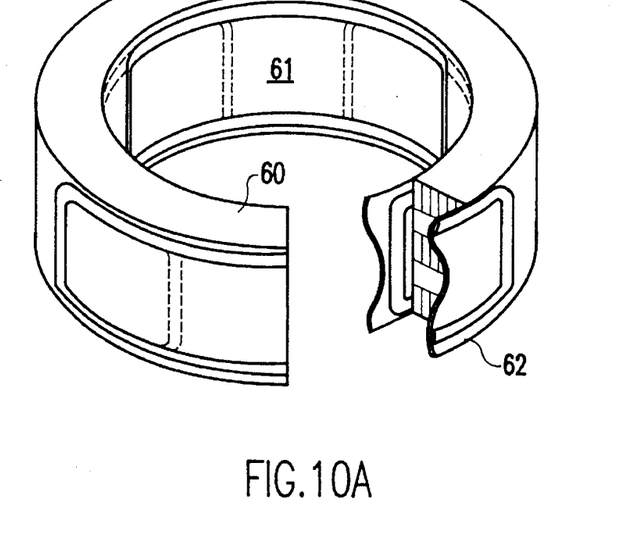
FIG. 10A is an isometric view, partially cut away, showing the core with minor inside and outside printed circuit saddle windings attached.

The embodiment of the minor saddle windings used in the tests are not the best for ease of constructing the dual yoke. These were wire wound on a form that was placed inside and outside of the toroidal winding after this winding was wound. A more preferred embodiment is to make the inner and outer saddle windings from flexible printed circuit (PC) material or flexible wound coils on flexible PC backing material. The inner winding can then be formed and attached to the inside of the core and the outer winding to the outside of the core. This is shown diagramtically in FIG. 10A in which an inner PC winding 61 and an outer PC winding 62 are attached to a stacked core 60. The forms for the major toroidal windings are attached over the core and PC coils and the toroidal distribution is wound on this form. This makes a simple dual yoke construction which is no more difficult to wind than a single toroidal yoke. The cancelling effect of the inner and outer saddle winding works equally well for the saddle winding being would inside or outside the toroidal windings.

Figure 10B:
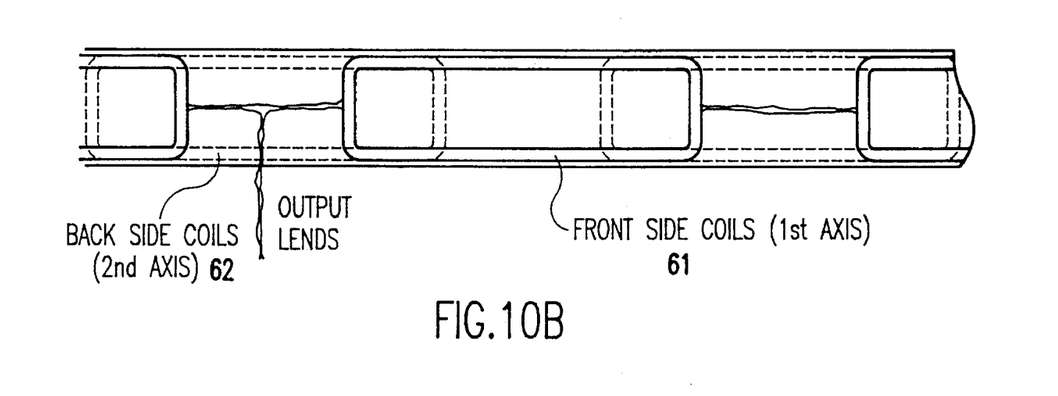
FIG. 10B is a view perpendicular to the axis of the yoke showing the relationship of the inside and outside printed circuit saddle windings for a printed circuit that has been unwrapped from the core.

Almost always a yoke, either single or dual, has two axes of deflection fields orthogonal to each other. In the dual yoke construction, both axes of minor windings use the flexible PC method with one axis on one side of the backing material and the other axis is on the other side for both the inner and outer windings, as shown in FIG. 10B. The forms for the major toroidal windings are then attached holding the PC saddle windings in place. The distribution of windings for the two axes of the toroid are then wound on the core forms at 90° to each other as described above.

While the invention has been described in terms of a single preferred embodiment with alternative variations, those skilled in the art will recognize that the invention can be practiced with modification within the spirit and scope of the appended claims.

Having thus described the invention, what I claim as new and desire to secure by Letters Patent is as follows:

1. In a charged particle beam system, a deflection yoke for controlling said charged particle beam, said deflection yoke comprising:

a major yoke winding; and a minor yoke winding, whereby said major and minor yoke windings are arranged to minimize mutual inductance between said major winding and said minor winding, wherein said major yoke winding is a toroidal winding about said core and said minor yoke winding is a saddle winding on said toroidal core.

2. The deflection yoke recited in claim 1 wherein said minor yoke winding comprises:

a first saddle winding inside said toroidal core; and a second saddle winding outside said toroidal core.

3. The deflection yoke recited in claim 2 further comprising a reactive shunt connected across said first saddle winding or said second saddle winding, said reactive shunt providing a shunt current path to balance the magnetic flux contribution of said first and second saddle windings so that excitation of said minor yoke does not induce any excitation in the major yoke.

4. The deflection yoke recited in claim 1 further comprising a toroidal core, said toroidal core comprises an alternating stack of ferromagnetic rings and non-ferromagnetic rings, said non-ferromagnetic rings being made of a ceramic having a coefficient of thermal expansion substantially matched to that of the ferromagnetic rings, whereby said core does not perturb the lens field.

5. The deflection yoke recited in claim 1 further comprising a toroidal core, said toroidal core comprises two concentric alternating stacks of ferromagnetic rings and non-ferromagnetic rings, said non-ferromagnetic rings being made of a ceramic having a coefficient of thermal expansion substantially matched to that of the ferromagnetic rings, whereby said core does not perturb the lens field.

6. The deflection yoke recited in claim 1 wherein said minor yoke is formed on a printed circuit material.

* * * * *